(12) United States Patent
Mizuhara

(10) Patent No.: US 6,376,886 B2
(45) Date of Patent: Apr. 23, 2002

(54) FIELD EFFECT TRANSISTOR HAVING COMB-SHAPED LEAD-OUT ELECTRODES CAPABLE OF REDUCING PARASITIC CAPACITANCE THEREBETWEEN

(75) Inventor: Noriaki Mizuhara, Shiga (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/800,149

(22) Filed: Mar. 5, 2001

(30) Foreign Application Priority Data

Mar. 29, 2000 (JP) ........................................ 2000-095251

(51) Int. Cl.⁷ ............................................. H01L 31/119
(52) U.S. Cl. ........................ 257/386; 257/372; 257/394
(58) Field of Search .............................. 257/372, 386, 257/394, 547, 595; 357/15, 22, 23, 41, 52, 90

(56) References Cited

U.S. PATENT DOCUMENTS 3,950,777 A * 4/1976 Tarui et al. .................... 357/23
4,972,237 A * 11/1990 Kawai .......................... 357/15

* cited by examiner

*Primary Examiner*—David Nelms
*Assistant Examiner*—Mai-Huong Tran
(74) *Attorney, Agent, or Firm*—Rosenman & Colin LLP

(57) ABSTRACT

In a field effect transistor including a semiconductor substrate which is divided into an active area and an inactive area, a comb-shaped gate electrode having a trunk portion formed on the inactive area and gate fingers formed on the active area, source ohmic electrodes and drain ohmic electrodes formed on the active area and alternating with the gate fingers of the comb-shaped gate electrodes, a comb-shaped source lead-out electrode having a trunk portion formed on the inactive area and fingers each connected to one of the source ohmic electrodes and formed on the active area, and a comb-shaped drain lead-out electrode having a trunk portion formed on the inactive area and fingers each connected to one of the drain ohmic electrodes and formed on the active area, edges of the fingers of the comb-shaped source lead-out electrode recede from edges of respective ones of the source ohmic electrodes, or edges of the fingers of the comb-shaped drain lead-out electrode recede from edges of respective ones of the drain ohmic electrodes.

9 Claims, 3 Drawing Sheets

FIELD EFFECT TRANSISTOR HAVING COMB-SHAPED LEAD-OUT ELECTRODES CAPABLE OF REDUCING PARASITIC CAPACITANCE THEREBETWEEN

BACKGROUND OF THE INVENTION

1. Field of the Invention

The present invention relates to a field effect transistor such as a metal semiconductor field effect transistor (MESFET) having comb-shaped lead-out electrodes.

2. Description of the Related Art

Generally, in a mobile telephone set, MESFETs using Schottky junction gates have been used as high speed switches for switching antennas which receive and transmit about 1 to 2 GHz signals.

A prior art MESFET uses comb-shaped electrodes in order to decrease the ON resistance. That is, the prior art MESFET is constructed by a semiconductor substrate which is divided into an active area and an inactive area, a comb-shaped gate electrode having a trunk portion formed on the inactive area and gate fingers formed on the active area, source ohmic electrodes and drain ohmic electrodes formed on the active area and alternating with the gate fingers of the comb-shaped gate electrodes, a comb-shaped source lead-out electrode having a trunk portion formed on the inactive area and fingers each connected to one of the source ohmic electrodes and formed on the active area, and a comb-shaped drain lead-out electrode having a trunk portion formed on the inactive area and fingers each connected to one of the drain ohmic electrodes and formed on the active area. In this case, the edges of the fingers of the comb-shaped source lead-out electrode are in proximity to the edges of the source ohmic electrodes, and the edges of the fingers of the comb-shaped drain lead-out electrode are in proximity to the edges of the drain ohmic electrodes. In other words, the comb-shaped source lead-out electrode and the comb-shaped drain lead-out electrode are completely interdigitated. This will be explained later in detail.

In the above-described prior art MESFET, however, since the comb-shaped source lead-out electrode and the comb-shaped drain lead-out electrode are completely interdigitated so that the opposing amount therebetween is very large, the parasitic capacitance between the lead-out electrodes is remarkably increased, which would decrease the operation speed.

SUMMARY OF THE INVENTION

It is an object of the present invention to provide a field effect transistor including comb-shaped electrodes capable of increasing the operation speed.

According to the present invention, in a field effect transistor including a semiconductor substrate which is divided into an active area and an inactive area, a comb-shaped gate electrode having a trunk portion formed on the inactive area and gate fingers formed on the active area, source ohmic electrodes and drain ohmic electrodes formed on the active area and alternating with the gate fingers of the comb-shaped gate electrodes, a comb-shaped source lead-out electrode having a trunk portion formed on the inactive area and fingers each connected to one of the source ohmic electrodes and formed on the active area, and a comb-shaped drain lead-out electrode having a trunk portion formed on the inactive area and fingers each connected to one of the drain ohmic electrodes and formed on the active area, edges of the fingers of the comb-shaped source lead-out electrode recede from edges of respective ones of the source ohmic electrodes, or edges of the fingers of the comb-shaped drain lead-out electrode recede from edges of respective ones of the drain ohmic electrodes.

Thus, the opposing amount between the lead-out electrodes is decreased to reduce the parasitic capacitance therebetween.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the preferred embodiments, a prior art MESFET will be explained with reference to FIGS. 1A and 1B. Note that FIG. 1A is a plan view and FIG. 1B is a cross-sectional view taken along the line I—I of FIG. 1A.

Figure 1A:
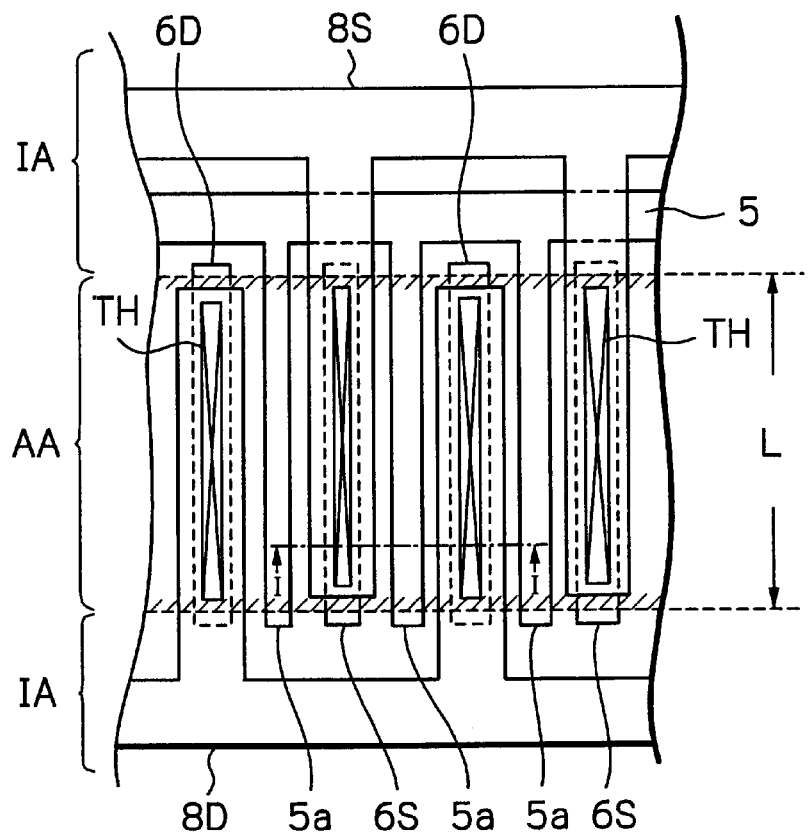
FIG. 1A is a plan view illustrating a prior art MESFET.
Figure 1B:
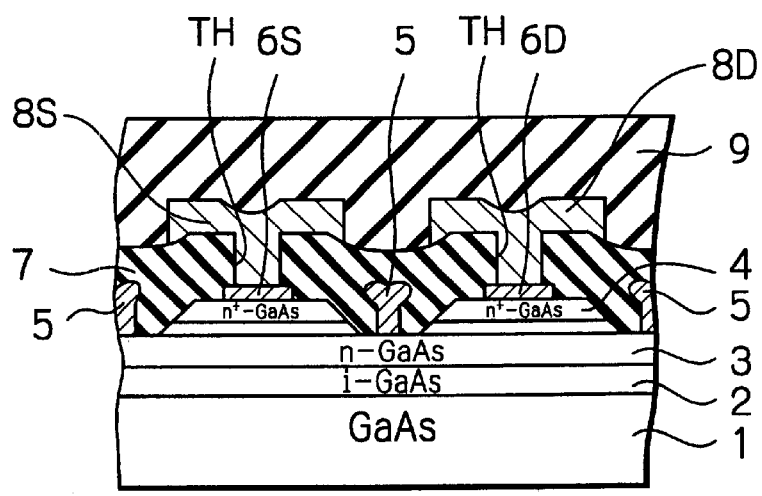
FIG. 1B is a cross-sectional view taken along the line I-I of FIG. 1A.

In FIGS. 1A and 1B, an i-type GaAs buffer layer 2, an n-type GaAs channel layer 3 and an $n^+$-type GaAs contact layer 4 are grown on a semi-insulating GaAs substrate 1 by a molecular beam epitaxy (MBE) process or the like. That is, the i-type GaAs buffer layer 2, the n-type GaAs channel layer 3 and the $n^+$-type GaAs contact layer 4 form one epitaxial layer.

Next, impurities such as boron ions are implanted into an inactive area IA of the $n^+$-type GaAs contact layer 4 and the GaAs channel layer 3 by using a photoresist mask (not shown) covering an active area AA. As a result, the $n^+$-type GaAs contact layer 4 and the GaAs channel layer 3 in the inactive area IA are of a p-type, i.e., inactive, while the $n^+$-type GaAs contact layer 4 and the GaAs channel layer 3 in the active area AA remain active.

Next, the $n^+$-type GaAs contact layer 4 and a part of the GaAs channel layer 3 are etched by a selective dry etching process. Then, a Schottky junction type comb-shaped gate electrode 5 having gate fingers 5a is formed directly on recess portions of the GaAs channel layer 3. In this case, the trunk portion of the gate electrode 5 is located on the inactive area IA. Also, source ohmic electrodes 6S and drain ohmic electrodes 6D are formed on the $n^+$-type GaAs contact layer 4. In this case, the source ohmic electrodes 6S and the drain ohmic electrodes 6D alternate with the gate fingers 5a.

Next, an insulating layer 7 made of silicon oxide is deposited on the entire surface by a chemical vapor deposition (CVD) process. Then, throughholes TH are perforated in the insulating layer 7 by a photolithography and etching process. In this case, the throughholes TH are entirely located on the source ohmic electrodes 6S and the drain ohmic electrodes 6D. Then, a comb-shaped (or multifingered) source lead-out electrode 8S and a comb-shaped (or multi-fingered) drain lead-out electrode 8D made of an Au plating layer are formed on the insulating layer 7, so that the source lead-out electrode 8S and the drain lead-out electrode 8D are connected via the throughholes TH to the source ohmic electrodes 6S and the drain ohmic electrodes 6D, respectively. Each of the comb-shaped source lead-out electrode 8S and the comb-shaped drain lead-out electrode 8D has a trunk portion formed on the inactive area IA and fingers formed on the active area AA. In this case, the edges of the fingers of the comb-shaped source lead-out electrode 8S are in proximity to the edges of the source ohmic electrodes 6S, and the edges of the fingers of the comb-shaped drain lead-out electrode 8D are in proximity to the edges of the drain ohmic electrodes 6D. In other words, the comb-shaped source lead-out electrode 8S and the comb-shaped drain lead-out electrode 8D are completely interdigitated, i.e., the fingers of the comb-shaped source lead-out electrode 8S completely oppose those of the comb-shaped drain lead-out electrode 8D.

Finally, a resin layer 9 is deposited to cover the entire surface.

In FIGS. 1A and 1B, the length of the gate fingers 5a should be as small as possible in view of the suppression of phase difference therebetween, particularly in the case of high frequencies. As a result, the length L of the active area AA is as small as possible. In order to compensate for the smaller length L of the active area AA, the number of the gate fingers 5a is increased, and also, the width of a trunk portion of the gate electrode 5 is increased, to substantially decrease the ON resistance thereof.

In the MESFET of FIGS. 1A and 1B, however, since the comb-shaped source lead-out electrode 8S and the comb-shaped drain lead-out electrode 8D are completely interdigitated so that the opposing amount therebetween is very large, and the resin layer 9 therebetween has a larger permittivity than that of the air, the parasitic capacitance between the lead-out electrodes 8S and 8D is remarkably increased, which would decrease the operation speed.

A first embodiment of the MESFET will be explained next with reference to FIGS. 2A and 2B. Note that FIG. 2A is a plan view, and FIG. 2B is a cross-sectional view taken along the line II—II of FIG. 2A.

Figure 2A:
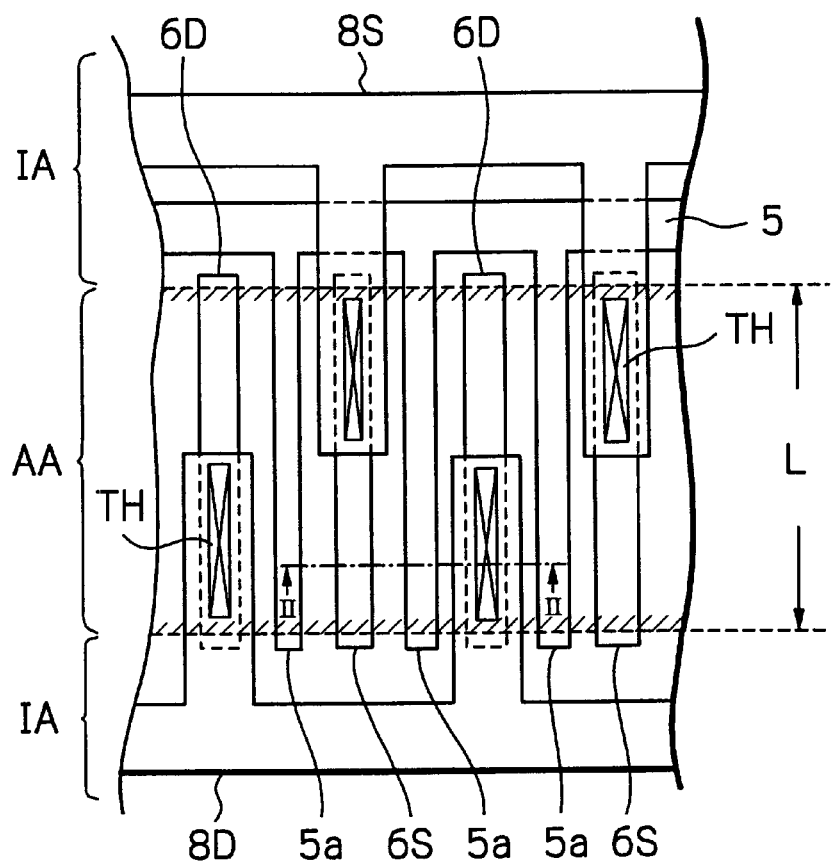
FIG. 2A is a plan view illustrating a first embodiment of the MESFET according to the present invention.
Figure 2B:
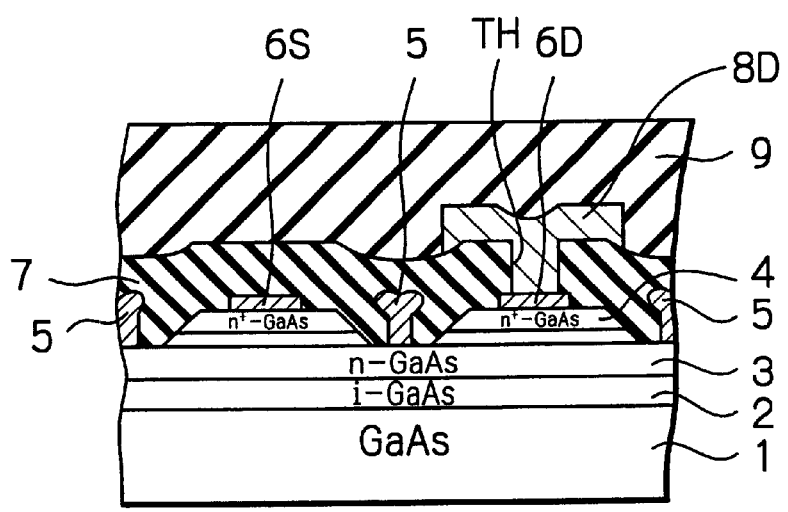
FIG. 2B is a cross-sectional view taken along the line II-II of FIG. 2A.

In FIGS. 2A and 2B, in the same way as in FIGS. 1A and 1B, an i-type GaAs buffer layer 2, an n-type GaAs channel layer 3 and an n$^+$-type GaAs contact layer 4 are grown on a semi-insulating GaAs substrate 1 by an MBE process or the like. That is, the i-type GaAs buffer layer 2, the n-type GaAs channel layer 3 and the n$^+$-type GaAs contact layer 4 form one epitaxial layer. Also, impurities such as boron ions are implanted into an inactive area of the n$^+$-type GaAs contact layer 4 and the GaAs channel layer 3 by using a photoresist mask (not shown) covering an active area AA. As a result, the n$^+$-type GaAs contact layer 4 and the GaAs channel layer 3 in the inactive area IA are of a p-type, i.e., inactive, while the n$^+$-type GaAs contact layer 4 and the GaAs channel layer 3 in the active area AA remain active. Further, the n$^+$-type GaAs contact layer 4 and a part of the GaAs channel GaAs layer 3 are etched by a selective dry etching process. Then, a Schottky junction type comb-shaped gate electrode 5 having gate fingers 5a is formed directly on recess portions of the GaAs channel layer 3. In this case, the trunk portion of the gate electrode 5 is located on the inactive area IA. Also, source ohmic electrodes 6S and drain ohmic electrodes 6D are formed on the n$^+$-type GaAs contact layer 4. In this case, the source ohmic electrodes 6S and the drain ohmic electrodes 6D alternate with the gate fingers 5a.

Next, an insulating layer 7 made of silicon oxide is deposited on the entire surface by a CVD process. Then, throughholes TH are perforated in the insulating layer 7 by a photolithography and etching process. In this case, the throughholes TH are located on a half of each of the source ohmic electrodes 6S and a half of each of the drain ohmic electrodes 6D. Then, a comb-shaped (or multi-fingered) source lead-out electrode 8S and a comb-shaped (or multi-fingered) drain lead-out electrode 8D made of an Au plating layer are formed on the insulating layer 7, so that the source lead-out electrode 8S and the drain lead-out electrode 8D are connected via the throughholes TH to the source ohmic electrodes 6S and the drain ohmic electrodes 6D, respectively. Each of the comb-shaped source lead-out electrode 8S and the comb-shaped drain lead-out electrode 8D has a trunk portion formed on the inactive area IA and fingers formed on the active area AA. In this case, the edges of the fingers of the comb-shaped source lead-out electrode 8S recede from the edges of the source ohmic electrodes 6S, and the edges of the fingers of the comb-shaped drain lead-out electrode 8D recede from the edges of the drain ohmic electrodes 6D. In other words, the comb-shaped source lead-out electrode 8S and the comb-shaped drain lead-out electrode 8D are not interdigitated, i.e., the fingers of the comb-shaped source lead-out electrode 8S do not oppose those of the comb-shaped drain lead-out electrode 8D.

Finally, a resin layer 9 is deposited to cover the entire surface.

In the MESFET of FIGS. 2A and 2B, since the comb-shaped source lead-out electrode 8S and the comb-shaped drain lead-out electrode 8D are not interdigitated, i.e., the comb-shaped source electrode 8S does not oppose the comb-shaped drain electrode 8D, the parasitic capacitance between the lead-out electrodes 8S and 8D is remarkably decreased even if the resin layer 9 has a large permittivity, which would increase the operation speed.

A second embodiments of the MESFET will be explained next with reference to FIGS. 3A and 3B. Note that FIG. 3A is a plan view, and FIG. 3B is a cross-sectional view taken along the line III–III of FIG. 3A.

Figure 3A:
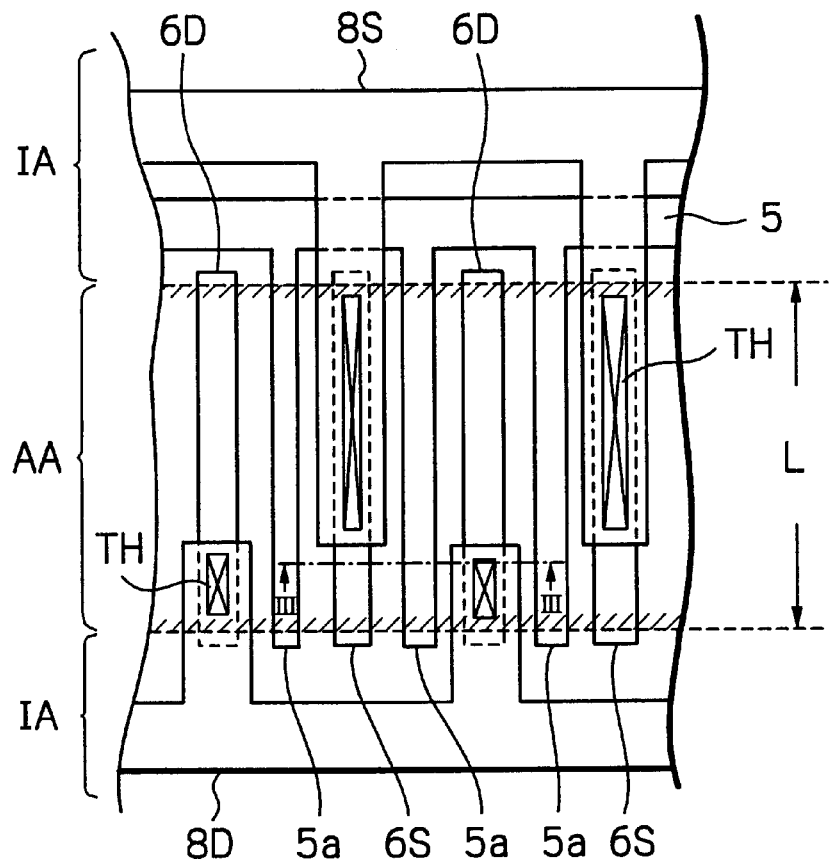
FIG. 3A is a plan view illustrating a second embodiment of the MESFET according to the present invention.
Figure 3B:
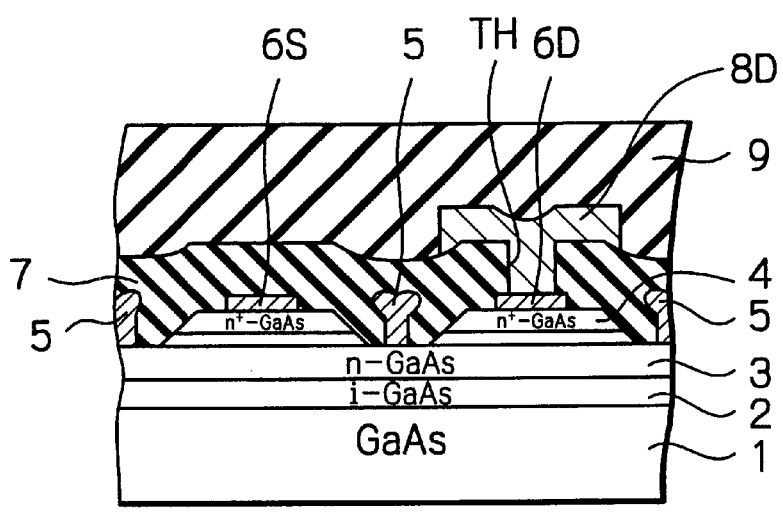
FIG. 3B is a cross-sectional view taken along the line III-III of FIG. 3A.

In FIGS. 3A and 3B, the throughholes TH on the side of the source ohmic electrodes 6S are located on a larger part thereof. On the other hand, the throughholes TH on the side of the drain ohmic electrodes 6D are located on a smaller part thereof. Then, a comb-shaped (or multi-fingered) source lead-out electrode 8S and a comb-shaped (or multi-fingered) drain lead-out electrode 8D made of an Au plating layer are formed on the insulating layer 7, so that the source lead-out electrode 8S and the drain lead-out electrode 8D are connected via the throughholes TH to the source ohmic electrodes 6S and the drain ohmic electrodes 6D, respectively. Each of the comb-shaped source lead-out electrode 8S and the comb-shaped drain lead-out electrode 8D has a trunk portion formed on the inactive area IA and fingers formed on the active area AA. In this case, the edges of the fingers of the comb-shaped source lead-out electrode 8S recede from the edges of the source ohmic electrodes 6S, while the edges of the fingers of the comb-shaped drain lead-out electrode 8D are in proximity to the edges of the drain ohmic electrodes 6D. Even in this case, the comb-shaped source lead-out electrode 8S and the comb-shaped drain lead-out electrode 8D are not interdigitated, i.e., the fingers of the comb-shaped source lead-out electrode 8S do not oppose those of the comb-shaped drain lead-out electrode 8D.

Finally, a resin layer 9 is deposited to cover the entire surface.

Even in the MESFET of FIGS. 3A and 3B, since the comb-shaped source lead-out electrode 8S and the comb-shaped drain lead-out electrode 8D are not interdigitated, i.e., the comb-shaped source electrode 8S does not oppose the comb-shaped drain electrode 8D, the parasitic capacitance between the lead-out electrodes 8S and 8D is remarkably decreased even if the resin layer 9 has a large permittivity, which would increase the operation speed.

In the MESFET of FIGS. 3A and 3B, the fingers of the drain lead-out electrode 8D recede while the fingers of the source lead-out electrode 8S do not recede. However, the fingers of the source lead-out electrode 8S can recede while the fingers of the drain lead-out electrode 8D do not recede.

Further, the present invention can be appled to other FETs such as MOSFETs where a comb-shaped source lead-out electrode and a comb-shaped drain lead-out electrode are provided so that the fingers thereof alternate with gate electrodes.

As explained hereinabove, according to the present invention, since the opposing amount between a comb-shaped drain lead-out electrode and a comb-shaped lead-out electrode is decreased, the source-to-drain parasitic capacitance can be decreased. Particularly, when the comb-shaped source lead-out electrode and the comb-shaped drain lead-out electrode are not interdigitated, i.e., the comb-shaped source lead-out electrode does not oppose the comb-shaped drain lead-out electrode, the source-to-drain parasitic capacitance can be remarkably decreased, which would increase the operation speed. In this case, since a source ohmic electrode and a drain ohmic electrode are unchanged, the increase of an ON resistance thereof can be suppressed.

What is claimed is:

1. A field effect transistor comprising:
   a semiconductor substrate which is divided into an active area and an inactive area;
   a comb-shaped gate electrode having a trunk portion formed on the inactive area of said semiconductor substrate and gate fingers connected to said trunk portion and formed on the active area of said semiconductor substrate;
   source ohmic electrodes and drain ohmic electrodes formed on the active area of said semiconductor substrate, said source ohmic electrodes and said drain ohmic electrodes alternating with the gate fingers of said comb-shaped gate electrodes;
   a comb-shaped source lead-out electrode having a trunk portion formed on the inactive area of said semiconductor substrate and fingers each connected to one of said source ohmic electrodes and formed on the active area of said semiconductor substrate; and
   a comb-shaped drain lead-out electrode having a trunk portion formed on the inactive area of said semiconductor substrate and fingers each connected to one of said drain ohmic electrodes and formed on the active area of said semiconductor substrate,
   edges of the fingers of said comb-shaped source lead-out electrode receding from edges of respective ones of said source ohmic electrodes.

2. The field effector transistor as set forth in claim 1, wherein the fingers of said comb-shaped source lead-out electrode and the fingers of said drain lead-out electrode are not interdigitated.

3. The field effect transistor as set forth in claim 1, further comprising a resin layer between said comb-shaped source lead-out electrode and said comb-shaped drain lead-out electrode.

4. The field effect transistor as set forth in claim 1, wherein edges of the fingers of said comb-shaped drain lead-out electrode recede from edges of respective ones of said drain ohmic electrodes.

5. The field effect transistor as set forth in claim 1, being a metal semiconductor field effect transistor where the gate fingers of said comb-shaped gate electrode form Schottky junctions with said semiconductor substrate.

6. A field effect transistor comprising:
   a semiconductor substrate which is divided into an active area and an inactive area;
   a comb-shaped gate electrode having a trunk portion formed on the inactive area of said semiconductor substrate and gate fingers connected to said trunk portion and formed on the active area of said semiconductor substrate;
   source ohmic electrodes and drain ohmic electrodes formed on the active area of said semiconductor substrate, said source ohmic electrodes and said drain ohmic electrodes alternating with the gate fingers of said comb-shaped gate electrodes;
   a comb-shaped source lead-out electrode having a trunk portion formed on the inactive area of said semiconductor substrate and fingers each connected to one of said source ohmic electrodes and formed on the active area of said semiconductor substrate; and
   a comb-shaped drain lead-out electrode having a trunk portion formed on the inactive area of said semiconductor substrate and fingers each connected to one of said drain ohmic electrodes and formed on the active area of said semiconductor substrate,
   edges of the fingers of said comb-shaped drain lead-out electrode receding from edges of respective ones of said drain ohmic electrodes.

7. The field effector transistor as set forth in claim 6, wherein the fingers of said comb-shaped source lead-out electrode and the fingers of said drain lead-out electrode are not interdigitated.

8. The field effect transistor as set forth in claim 6, further comprising a resin layer between said comb-shaped source lead-out electrode and said comb-shaped drain lead-out electrode.

9. The field effect transistor as set forth in claim 6, being a metal semiconductor field effect transistor where the gate fingers of said comb-shaped gate electrode form Schottky junctions with said semiconductor substrate.

* * * * *